(12) United States Patent
Ward et al.

(10) Patent No.: US 8,354,816 B2
(45) Date of Patent: Jan. 15, 2013

(54) POWER MODULE LAYOUT FOR AUTOMOTIVE POWER CONVERTERS

(75) Inventors: Terence G. Ward, Redondo Beach, CA (US); Edward P. Yankoski, Corona, CA (US)

(73) Assignee: GM Global Technology Operations, LLC, Detroit, MI (US)

( * ) Notice: Subject to any disclaimer, the term of this patent is extended or adjusted under 35 U.S.C. 154(b) by 0 days.

(21) Appl. No.: 12/891,316

(22) Filed: Sep. 27, 2010

(65) Prior Publication Data
US 2011/0012425 A1   Jan. 20, 2011

Related U.S. Application Data

(63) Continuation of application No. 12/120,911, filed on May 15, 2008, now abandoned.

(60) Provisional application No. 60/952,780, filed on Jul. 30, 2007, provisional application No. 60/952,765, filed on Jul. 30, 2007.

(51) Int. Cl.
*H02M 1/00* (2007.01)
*H02M 7/537* (2006.01)

(52) U.S. Cl. ......... 318/800; 361/718; 363/144; 363/147

(58) Field of Classification Search .......... 318/722, 318/800, 801–803; 361/605, 702, 703, 710, 361/717–719, 721–723, 807, 809, 746, 775; 363/40, 55, 58, 37, 15, 131, 132, 144–147, 363/321; 257/678, 687, 691, 762; 174/50.52; 180/65.8

See application file for complete search history.

(56) References Cited

U.S. PATENT DOCUMENTS

| | | | |
|---|---|---|---|
| 5,504,378 A | | 4/1996 | Lindberg et al. |
| 5,512,782 A | | 4/1996 | Kobayashi |
| 5,552,976 A | * | 9/1996 | Munro et al. ............ 363/39 |
| 6,154,383 A | * | 11/2000 | Cardwell, Jr. ............ 363/71 |
| 6,178,514 B1 | | 1/2001 | Wood |
| 6,310,468 B1 | * | 10/2001 | Feldtkeller ............ 323/282 |

(Continued)

FOREIGN PATENT DOCUMENTS
JP      07274537      10/1995

OTHER PUBLICATIONS

Office Action mailed Dec. 8, 2010, issue in U.S. Appl. No. 12/178,865.

(Continued)

*Primary Examiner* — Eduardo Colon
(74) *Attorney, Agent, or Firm* — Ingrassia Fisher & Lorenz, P.C.

(57) ABSTRACT

An automotive power converter is provided. The automotive power converter includes a substrate, first and second electronic devices on the substrate, at least one conductive member coupled to the substrate and having a first device portion electrically coupled to the first electronic device and a second device portion electrically coupled to the second electronic device, and first and second terminals electrically coupled to the at least one conductive member. When a power supply is coupled to the first and second terminals, current flows from the first terminal to the first device portion substantially in a first direction and from the second terminal to the second device portion substantially in a second direction. The first direction has a first component and the second direction has a second component opposing the first component.

20 Claims, 7 Drawing Sheets

U.S. PATENT DOCUMENTS

| | | | |
|---|---|---|---|
| 6,525,950 B1 | 2/2003 | Shirakawa et al. | |
| 6,943,455 B1 | 9/2005 | Maxwell | |
| 7,224,145 B2 | 5/2007 | Pierret et al. | |
| 7,323,860 B2 | 1/2008 | Kaneda | |
| 7,560,887 B2 * | 7/2009 | Pierret et al. | 318/490 |
| 7,561,429 B2 | 7/2009 | Yahata et al. | |
| 7,570,008 B2 | 8/2009 | Inaba et al. | |
| 7,683,511 B2 | 3/2010 | Iwashima et al. | |
| 7,742,303 B2 | 6/2010 | Azuma et al. | |
| 7,872,383 B2 * | 1/2011 | Dubuc et al. | 310/68 R |
| 7,932,649 B2 * | 4/2011 | Dubuc et al. | 310/71 |
| 2006/0007721 A1 | 1/2006 | Rodriguez et al. | |
| 2006/0152085 A1 | 7/2006 | Flett et al. | |
| 2007/0138651 A1 | 6/2007 | Hauenstein | |
| 2009/0032320 A1 | 2/2009 | Ward et al. | |
| 2009/0033410 A1 | 2/2009 | Nelson et al. | |
| 2009/0034310 A1 | 2/2009 | Ward et al. | |
| 2009/0285004 A1 | 11/2009 | Welchko | |
| 2010/0073980 A1 | 3/2010 | Jang et al. | |

OTHER PUBLICATIONS

U.S. Office Action for U.S. Appl. No. 12/178,897 mailed Feb. 14, 2011.

Chinese Office Action, dated Sep. 21, 2011, for Chinese Patent Application No. 200810215441.8.

Final Office Action mailed May 26, 2011 for U.S. Appl. No. 12/178,865.

U.S. Office Action, dated Oct. 28, 2011, for U.S. Appl. No. 12/178,865.

USPTO, U.S. Office Action mailed Apr. 10, 2012 for U.S. Appl. No. 12/178,865.

U.S. Notice of Allowance, dated Sep. 19, 2012, for U.S. Appl. No. 12/178,865.

* cited by examiner

US 8,354,816 B2

POWER MODULE LAYOUT FOR AUTOMOTIVE POWER CONVERTERS

CROSS-REFERENCE TO RELATED APPLICATIONS

This application is a continuation of U.S. application Ser. No. 12/120,911, filed May 15, 2008, which claims the benefit of U.S. Provisional Application No. 60/952,780, filed Jul. 30, 2007 (the entire content of which is incorporated by reference herein); and claims the benefit of U.S. Provisional Application No. 60/952,765, filed Jul. 30, 2007 (the entire content of which is incorporated by reference herein).

TECHNICAL FIELD

The present invention generally relates to automotive power converters, and more particularly relates to an improved layout for automotive power converter power modules.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel vehicles, such as hybrid, electric, and fuel cell vehicles. Such alternative fuel vehicles typically use one or more electric motors, perhaps in combination with another actuator, to drive the wheels. Additionally, such automobiles may also include other motors, as well as other high voltage components, to operate the other various systems within the automobile, such as the air conditioner.

Due to the fact that alternative fuel automobiles typically include only direct current (DC) power supplies, direct current-to-alternating current (DC/AC) inverters (or power inverters) are provided to convert the DC power to alternating current (AC) power, which is generally required by the motors. Such vehicles, particularly fuel cell vehicles, also often use two separate voltage sources, such as a battery and a fuel cell, to power the electric motors that drive the wheels. Thus, power converters, such as direct current-to-direct current (DC/DC) converters, are typically also provided to manage and transfer the power from the two voltage sources.

As the power demands on the electrical systems in alternative fuel vehicles continue to increase, there is an ever increasing need to maximize the efficiency and reliability of such systems. Additionally, there is a constant desire to reduce the space required by the components within the electrical systems in order to minimize the overall cost and weight of the vehicles.

Accordingly, it is desirable to provide an improved layout for power inverters and converters. Furthermore, other desirable features and characteristics of the present invention will become apparent from the subsequent detailed description and the appended claims, taken in conjunction with the accompanying drawings and the foregoing technical field and background.

SUMMARY OF THE INVENTION

An automotive power converter is provided. The automotive power converter includes a substrate, first and second electronic devices on the substrate, at least one conductive member coupled to the substrate and having a first device portion electrically coupled to the first electronic device and a second device portion electrically coupled to the second electronic device, and first and second terminals electrically coupled to the at least one conductive member. When a power supply is coupled to the first and second terminals, current flows from the first terminal to the first device portion substantially in a first direction and from the second terminal to the second device portion substantially in a second direction. The first direction has a first component and the second direction has a second component opposing the first component.

An automotive power inverter is provided. The automotive power inverter includes a substrate, first and second electronic devices on the substrate, a bus bar coupled to the substrate and having a first device portion electrically coupled to the first electronic device and a second device portion electrically coupled to the second electronic device, and first and second terminals electrically coupled to the bus bar on opposing sides of the first and second electronic devices. When a power supply is coupled to the first and second terminals, current flows from the first terminal to the first device portion substantially in a first direction and from the second terminal to the second device portion substantially in a second direction. An angle between the first and second directions is at least 90 degrees.

An automotive drive system is provided. The automotive drive system includes an electric motor, a direct current (DC) power supply coupled to the electric motor, a power inverter coupled to the electric motor and the DC power supply to receive DC power from the DC power supply and provided alternating current (AC) power to the electric motor, and a processor in operable communication with and configured to control the electric motor, the DC power supply, and the power inverter. The power inverter includes a substrate, first and second electronic devices on the substrate, at least one conductive member coupled to the substrate and having a first device portion electrically coupled to the first electronic device and a second device portion electrically coupled to the second electronic device, and first and second terminals electrically coupled to the at least one conductive member. When a power supply is coupled to the first and second terminals, current flows from the first terminal to the first device portion substantially in a first direction and from the second terminal to the second device portion substantially in a second direction. An angle between the first and second directions is at least 90 degrees.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-8 are merely illustrative and may not be drawn to scale.

FIG. 1 to FIG. 8 illustrate an automotive power converter (or inverter). The automotive power converter includes a substrate, first and second electronic devices on the substrate, and at least one conductive member coupled to the substrate. The conductive member, or bus bar, has a first device portion electrically coupled to the first electronic device and a second device portion electrically coupled to the second electronic device. First and second terminals are electrically coupled to the at least one conductive member. When a power supply is coupled to the first and second terminals, current flows from the first terminal to the first device portion substantially in a first direction and from the second terminal to the second device portion substantially in a second direction. The first direction has a first component and the second direction has a second component opposing the first component.

In one embodiment, the first and second terminals are on opposing sides of the electronic devices, and the first and second direction have an angle between them of 180 degrees (i.e., the directions are opposite).

The layout of the power converter provides a more even distribution of current flow. As such, the reliability and overall performance of the power converter is improved.

Figure 1:
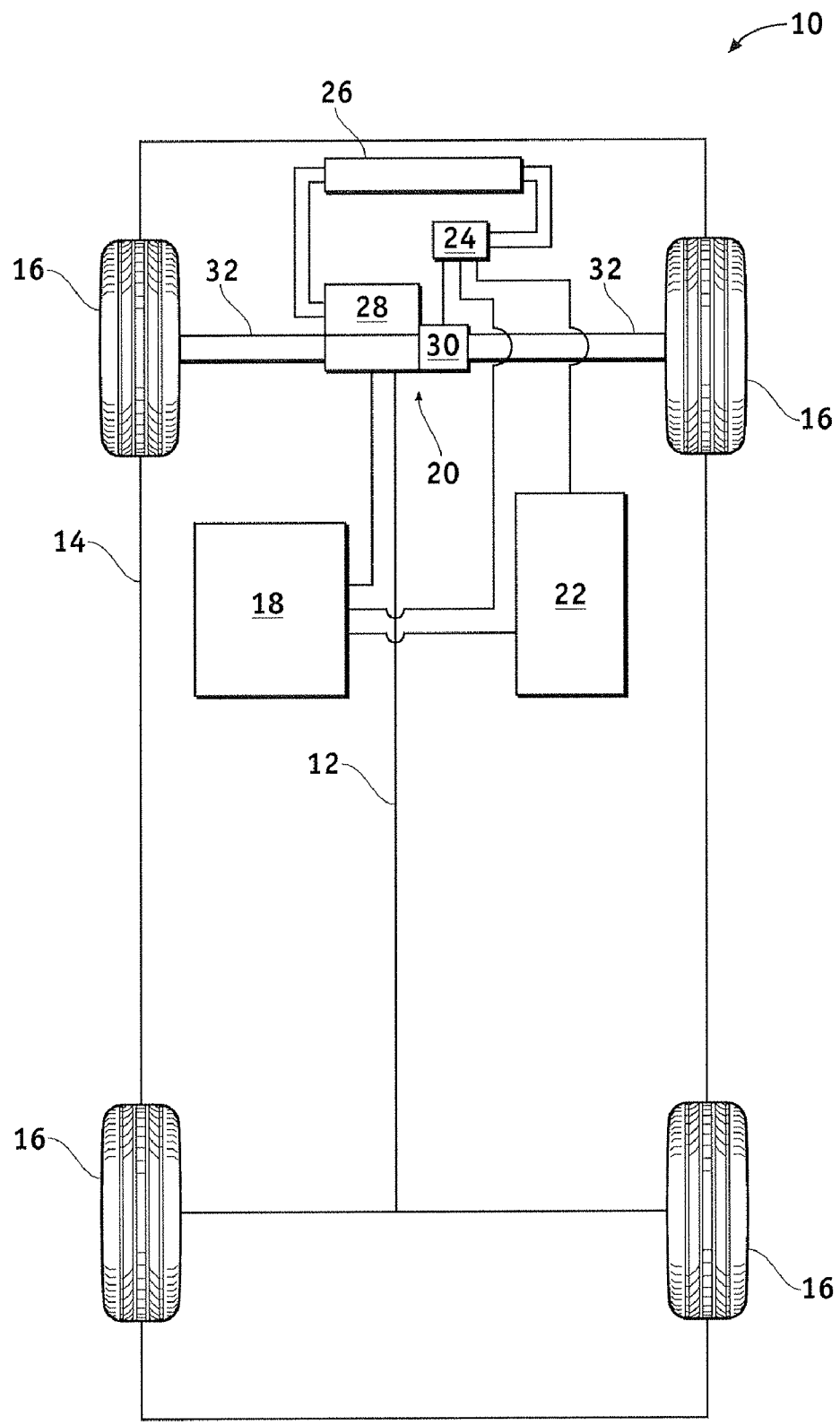
FIG. 1 is a schematic view of an exemplary automobile according to one embodiment of the present invention.

FIG. 1 illustrates a vehicle 10, or "automobile," according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The vehicle 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid vehicle, and further includes an actuator assembly 20, a battery 22, a power inverter assembly (or inverter) 24, and a radiator 26. The actuator assembly 20 includes a combustion engine 28 and an electric motor/generator (or motor) 30. As will be appreciated by one skilled in the art, the electric motor 30 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 30 may include multiple electromagnetic poles (e.g., sixteen poles), as is commonly understood.

Still referring to FIG. 1, in one embodiment, the combustion engine 28 and the electric motor 30 are integrated such that both are mechanically coupled to at least some of the wheels 16 through one or more drive shafts 32. The radiator 26 is connected to the frame at an outer portion thereof and although not illustrated in detail, includes multiple cooling channels therein that contain a cooling fluid (i.e., coolant) such as water and/or ethylene glycol (i.e., "antifreeze) and is coupled to the engine 28 and the inverter 24.

Figure 2:
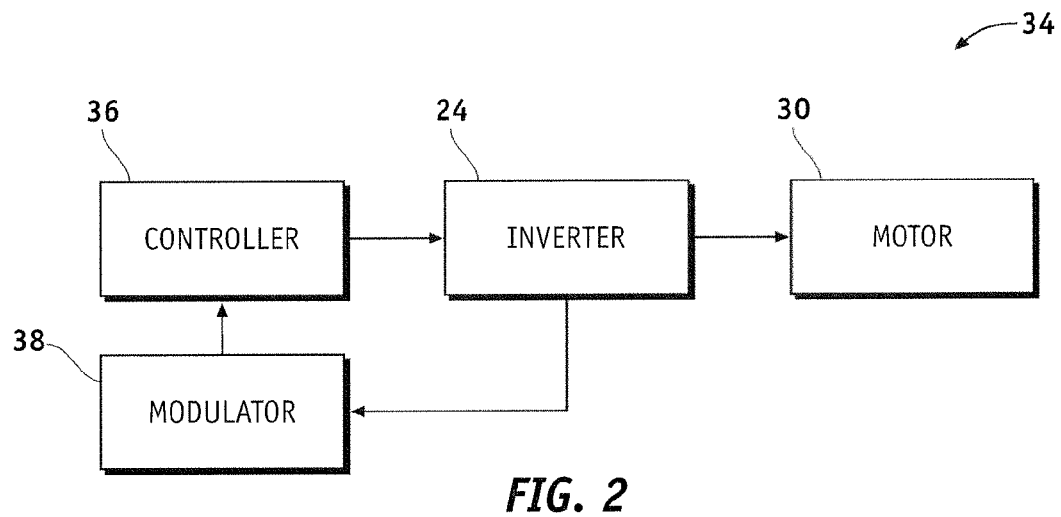
FIG. 2 is a block diagram of a voltage source inverter system within the automobile of FIG. 1.

Referring to FIG. 2, a voltage source inverter system (or electric drive system) 34 is shown in accordance with an exemplary embodiment of the present invention. The voltage source inverter system 34 includes a controller 36 coupled to an output of a modulator 38, which in turn has an input coupled to a first output of the inverter 24. The controller 36 has an output coupled to an input of the inverter 24, which has a second output coupled to the motor 30. The controller 36 and the modulator 38 may be integral with the electronic control system 18 shown in FIG. 1.

Figure 3:
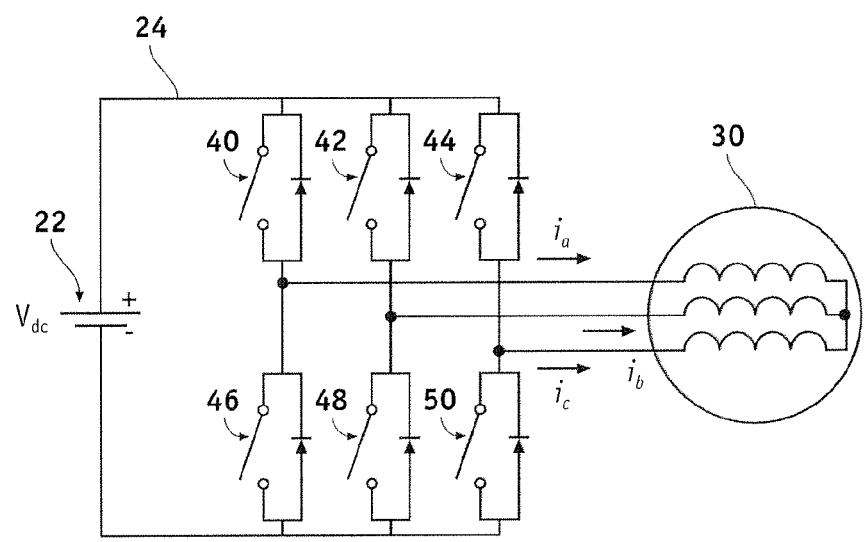
FIG. 3 is a schematic view of an inverter within the automobile of FIG. 1.

FIG. 3 illustrates the inverter 24 of FIGS. 1 and 2 in greater detail. The inverter 24 includes a three-phase circuit coupled to the motor 30. More specifically, the inverter 24 includes a switch network having a first input coupled to a voltage source $V_{dc}$ (e.g., the battery 22) and an output coupled to the motor 30. Although a single voltage source is shown, a distributed direct current (DC) link with two series sources may be used.

The switch network comprises three pairs (a, b, and c) of series switches with antiparallel diodes (i.e., antiparallel to each switch) corresponding to each of the phases of the motor 30. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and having a first terminal coupled to a second terminal of the respective first switch 40, 42, and 44.

Figure 4:
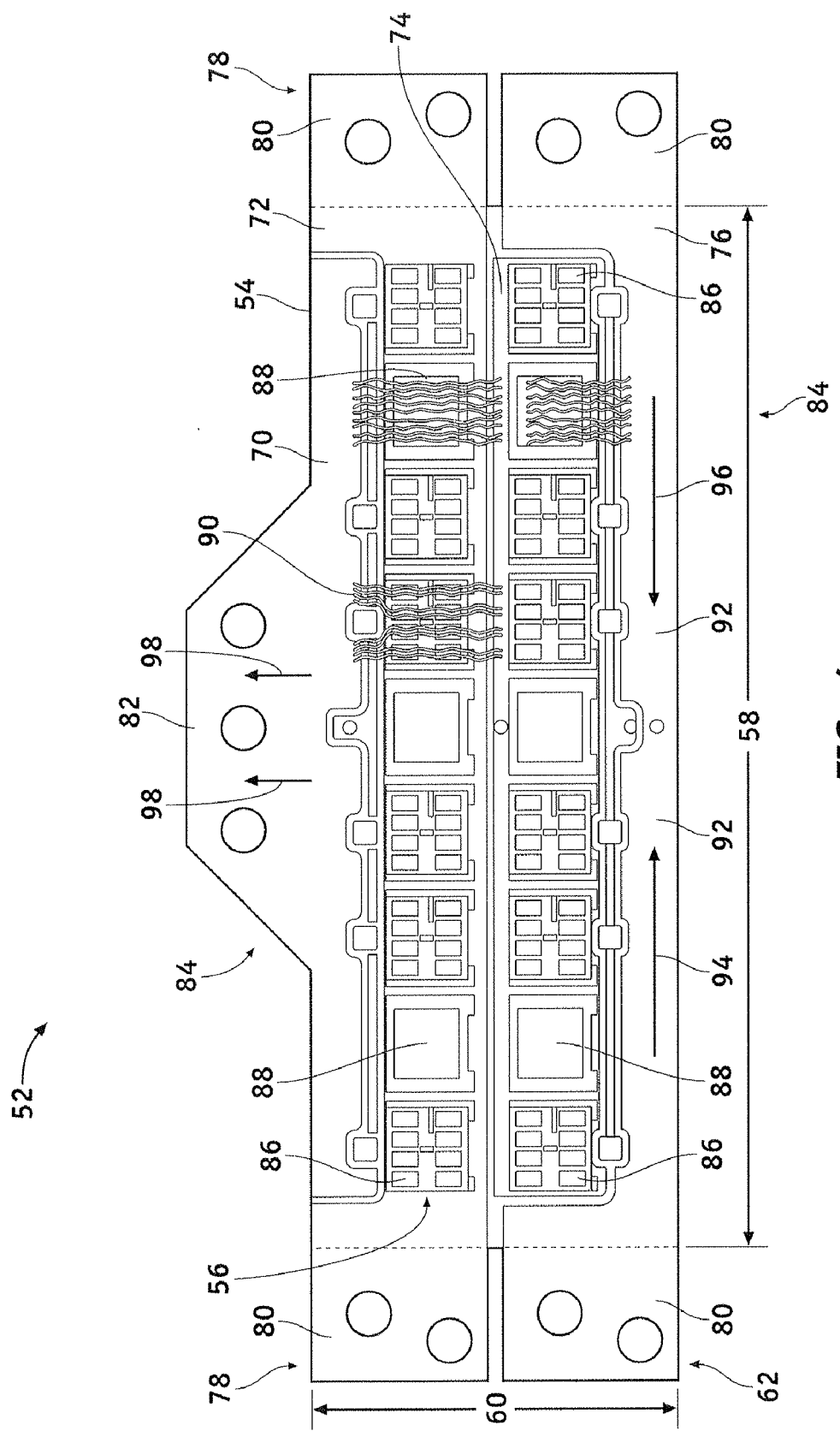
FIG. 4 is a plan view of an upper surface of a power module within the inverter of FIG. 3 according to one embodiment of the present invention.
Figure 5:
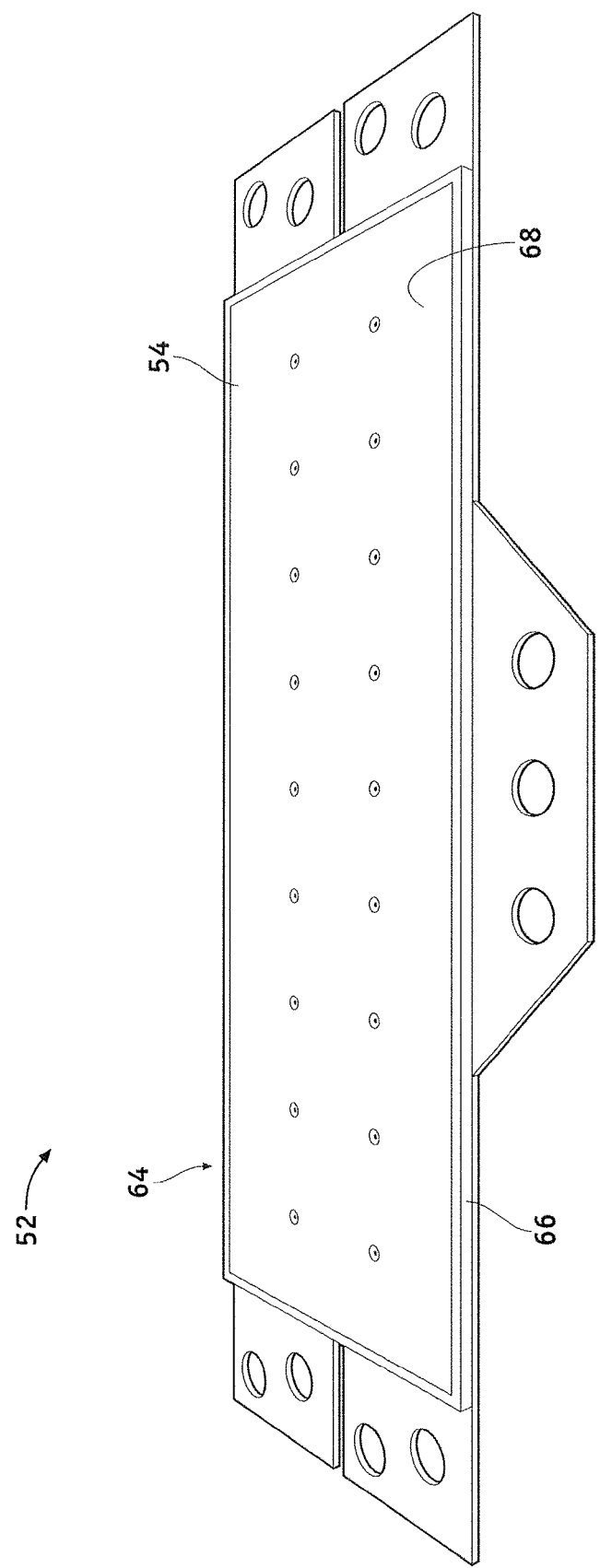
FIG. 5 is a plan view of a lower surface of the power module of FIG. 4.

FIGS. 4 and 5 illustrate a power module 52 of the inverter 24 according to one embodiment of the invention. The power module 52 includes a substrate 54 and multiple electronic devices 56 on the substrate 54. The substrate 54 is substantially rectangular with, for example, a length 58 between 100 and 120 millimeters (mm), a width 60 between 20 and 30 mm, and a thickness (not shown) of between 1 and 5 mm. The substrate 54 has an upper surface 62 and a lower surface 64 and, in one embodiment, is a direct bonded copper (DBC) substrate, as is commonly understood, with a ceramic core 66 (e.g., alumina or aluminum nitride) and copper layers 68 formed on, or bonded to, opposing sides (i.e., the upper and lower surfaces 62 and 64) of the core 66.

Referring specifically to FIG. 4, the copper layer 68 on the upper surface 62 is etched to form various conductive members (e.g., bus bars) 70, 72, 74, and 76 substantially extending between opposing ends 78 of the substrate 54. As shown, DC terminals 80 are connected to bus bars 72 and 76 at the opposing ends 78 of the power module 52, and an alternating current (AC) terminal 82 is connected to bus bar 70 along one of two opposing sides 84 of the power module 52.

The electronic devices 56 include two rows of transistor die 86 and diode die 88 mounted to bus bars 72 and 74, respectively. The transistor die 86 each include a semiconductor substrate (e.g., silicon substrate) with an integrated circuit formed thereon that includes one or more of the switches in the form of individual semiconductor devices, such as insulated gate bipolar transistors (IGBTs), as is commonly understood.

Still referring to FIG. 4, the power module also includes a plurality of wire bonds 90 that interconnect the electronic devices 56 and the bus bars 70, 72, 74, and 76. For illustrative clarity, only some of the wire bonds 90 are shown in FIG. 4. It should be noted that the electrical connections between the die 86 and 88 on bus bar 72 and the DC terminals 80 connected to bus bar 72 are made where the die 86 and 88 are connected to bus bar 72 (i.e., device portions of bus bar 72). However, the electrical connections between the die 86 and 88 on bus bar 74 and the DC terminals connected to bus bar 76 are made via the wire bonds 90 that connect the die 86 and 88 on bus bar 74 to device portions 92 of bus bar 76. Thus, the device portions (i.e., the portions of bus bars 72 and 76) into which DC current flows) are located between the DC terminals 80 of the respective bus bars 72 and 76.

In other words, if the bus bars 72 and 76 are considered to be conductive wires or traces, the DC terminals 80 are connected to the opposing ends of the traces, and the device portions of the bus bars are connected to the traces between the opposing ends. As suggested in FIG. 3, the DC terminals 80 are electrically connected to the battery 22 (FIG. 1), while the AC terminal 82 is electrically connected to the motor 30. It should be noted that each of the electronic devices 56 (e.g., first, second, third, fourth, etc.) may be considered to have a respective device portion 92 on bus bar 72 or 76.

FIG. 5 illustrates the lower surface 64 of the power module 52. As shown, the copper layer 68 on the lower surface 64 is etched only around a periphery thereof such to form a heat sink or cooling plate that is electrically disconnected from bus bars 70, 72, 74 and 76 and die 86 and 88. Although not specifically shown, the lower surface 64 of the power module 52 may be placed into contact with a cooling device, such as a heat sink, or a cold plate through which a wicking fluid is flown, to remove heat produced during operation, as is commonly understood in the art.

Referring again to FIG. 1, in the depicted embodiment, the inverter 24 receives and shares coolant with the electric motor 30. The radiator 26 may be similarly connected to the inverter 24 and/or the electric motor 30. The electronic control system 18 is in operable communication with the actuator assembly 20, the battery 22, and the inverter 24. Although not shown in detail, the electronic control system 18 includes various sensors and automotive control modules, or electronic control units (ECUs), such as an inverter control module and a vehicle controller, and at least one processor and/or a memory which includes instructions stored thereon (or in another computer-readable medium) for carrying out the processes and methods as described below. It should also be understood that the electronic control system 18 may include, or be integral with, portions of the inverter system 24 shown in FIG. 2, such as the controller 36 and the modulator 38.

During operation, referring to FIGS. 1 and 2, the vehicle 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 (and, in the case of a fuel cell automobile, a fuel cell) to the inverter 24, which converts the DC power into AC power, before the power is sent to the electric motor 30. As will be appreciated by one skilled in the art, the conversion of DC power to AC power is substantially performed by operating (i.e., repeatedly switching) the transistors 33 within the inverter 24 at a "switching frequency" ($F_{sw}$), such as, for example, 12 kilohertz (kHz). Generally, the controller 36 produces a Pulse Width Modulation (PWM) signal for controlling the switching action of the inverter 24. In a preferred embodiment, the controller 36 preferably produces a discontinuous PWM (DPWM) signal having a single zero vector associated with each switching cycle of the inverter 24. The inverter 24 then converts the PWM signal to a modulated voltage waveform for operating the motor 30.

Referring now to FIGS. 3 and 4, the DC current that is provided to the inverter 24 flows into the power module 52 at the DC terminals 80 at the opposing ends 78. The current then flows toward the center of the power module 52 where it is delivered to the various electronic devices 56. Thus, DC current is provided to the electronic devices 56, or more specifically, the device portions 92 of bus bars 72 and 76, from first and second opposing directions 94 and 96 (as indicated by arrows 94 and 96). That is, directions 94 and 96 have respective first and second components that substantially oppose each other (e.g., are 180 degrees apart), while the directions 94 and 96 themselves have an angle between them of at least 90 degrees. Although the arrows 94 and 96 are shown only on bus bar 76, it should be understood that the current flows from the DC terminals 80 connected to bus bar 72 to the device portions of bus bar 72 in a similar manner (e.g., in third and fourth directions that are parallel to the first and second directions, respectively). As will be appreciated by one skilled in the art, the current density within bus bars 72 and 76 is progressively greater near the ends 78 of the power module 52.

After passing through the various electronic devices 56 and being converted into AC current, the current flows into bus bar 70 and from the power module 52 through the AC terminal 82 in a fifth direction 98 (as indicated by arrows 98) that is substantially perpendicular to the first, second, third, and fourth directions. The AC current is then provided to the motor 30, as described above.

One advantage of the power module described above is that the current flows through the bus bars into the electronic devices in opposing directions. Therefore, the current, and thus heat generated by the current, is more evenly distributed throughout the bus bars. As a result, the performance and the reliability of the power module are improved.

Figure 6:
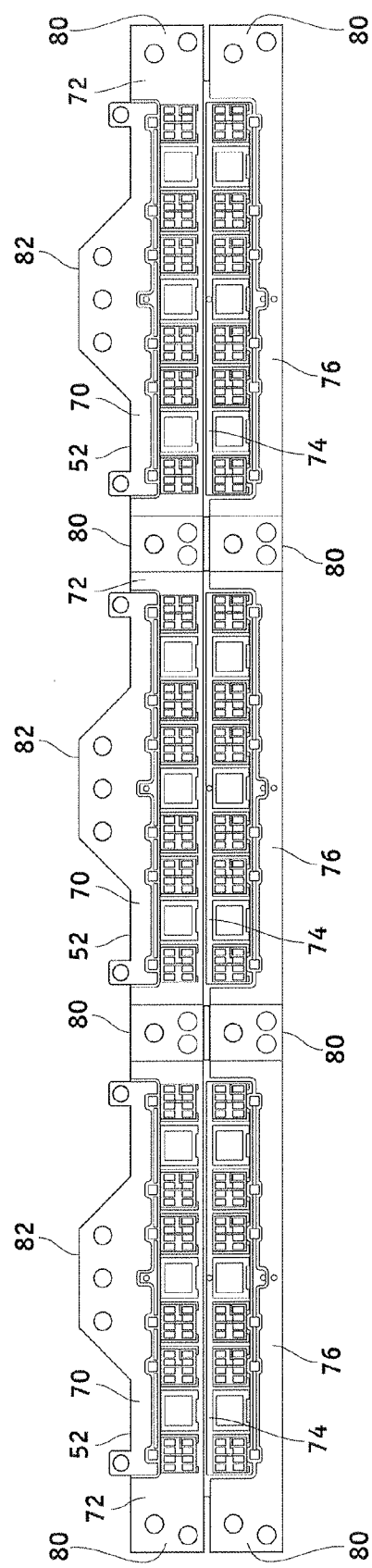
FIG. 6-8 are plan views of arrangements of multiple power modules according to various embodiments of the present invention.
Figure 7:
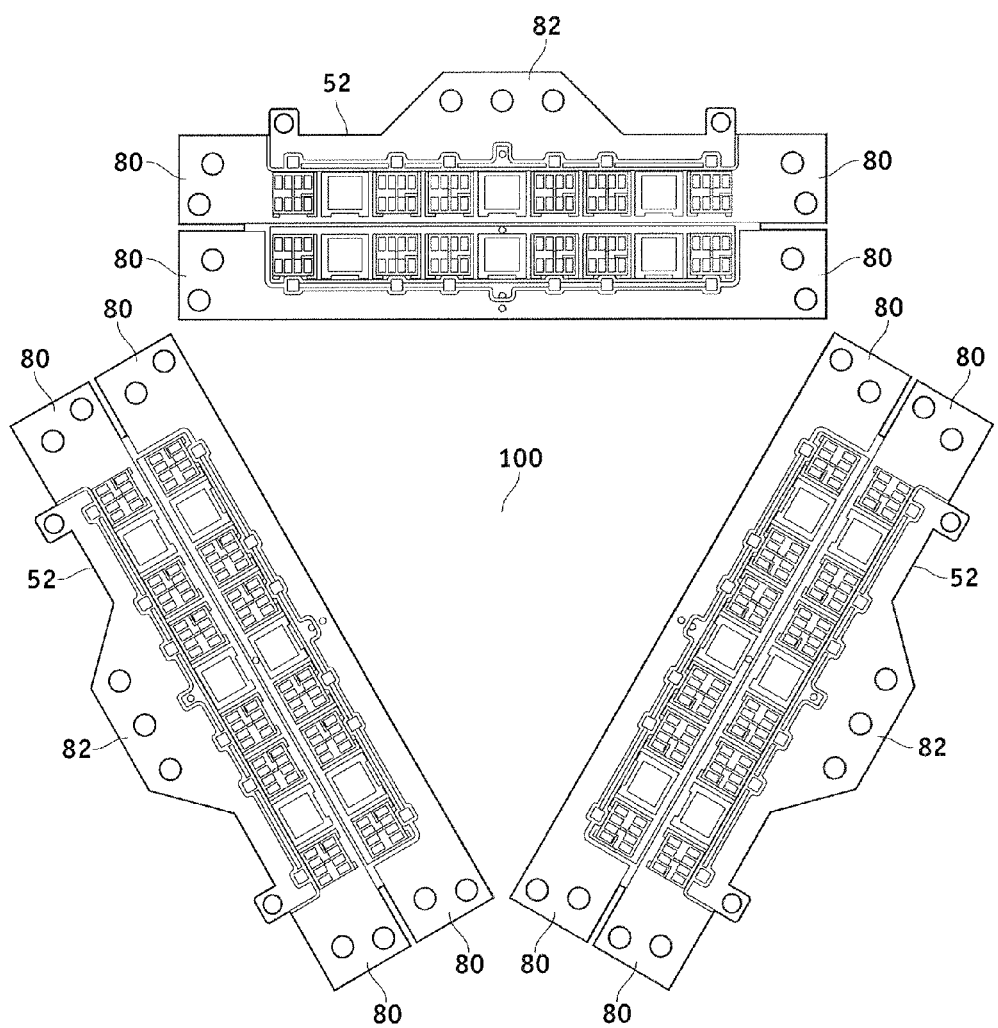
Figure 8:
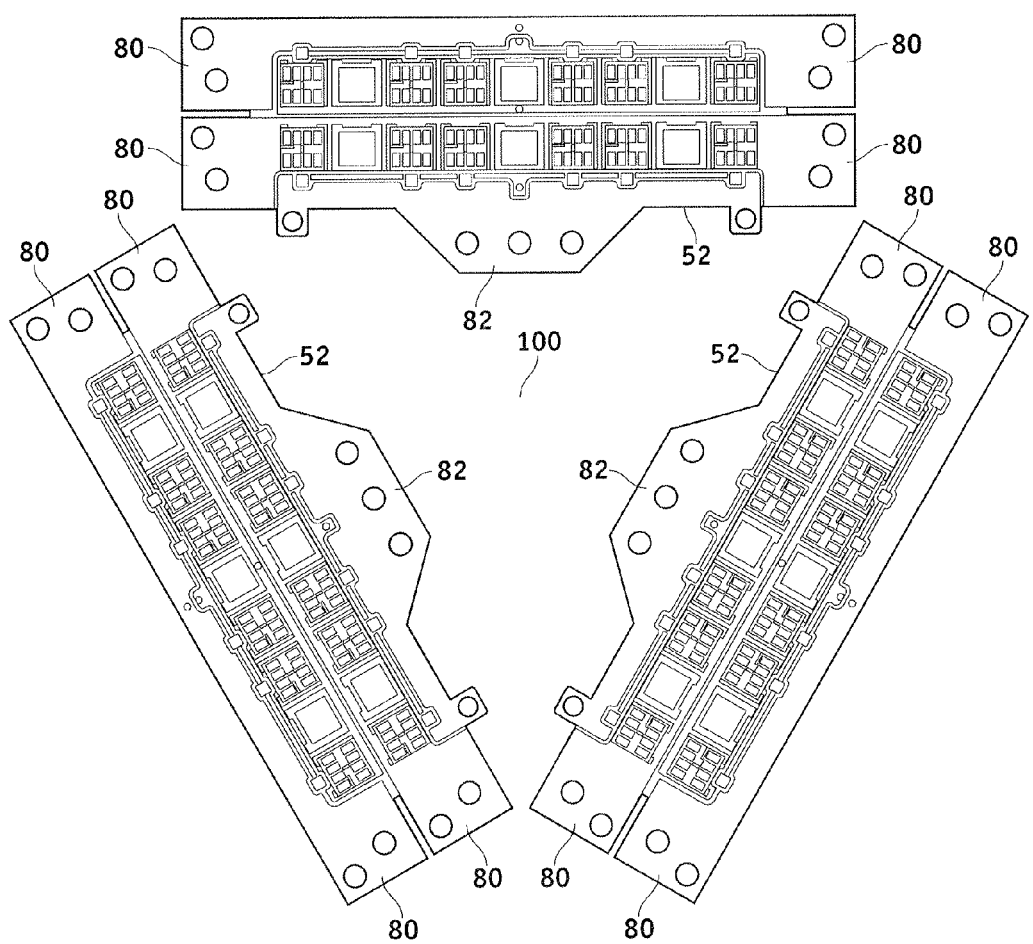

Another advantage of the power module is that it allows for greater flexibility in how multiple power modules are arranged. FIGS. 6, 7, and 8 illustrate arrangements of three of the power modules 52 (i.e., one for each phase) according to various embodiments of the present invention. In the embodiment shown in FIG. 6, the power modules 52 are in a linear arrangements with the bus bars 70-76 of aligned in a substantially parallel fashion. FIGS. 7 and 8 show the power modules 52 arranged in "loop" configurations around an opening 100. In the embodiment shown in FIG. 7, the power modules 52 are arranged with the AC terminals 82 on opposing, or outer, sides of the opening 100, while in FIG. 8, the AC terminals are located adjacent the opening 100. Although not shown, for packing efficiency, some of the components of the automobile, such as the electric motor, may be placed within the opening 100, or at least such that the shaft of the motor extends through the opening 100.

Other embodiments may utilize different numbers of power modules, such as six or eight, arranged in various polygons, such as hexagons or octagons. Each of the power modules may correspond to an individual phase of the operation of the motor, or several of the power modules may be connected in parallel to jointly correspond to a single phase of the operation of the motor.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An automotive power converter for use with a power supply, comprising:
    a substrate;
    first and second electronic devices mounted on said substrate;
    at least one conductive member coupled to said substrate, said at least one conductive member having a first device portion electrically coupled to said first electronic device and a second device portion electrically coupled to said second electronic device; and
    first and second terminals electrically coupled to said at least one conductive member such that when a power supply is connected to said first and second terminals, current flows from the first terminal to the first device portion in a first direction and from said second terminal to said second device portion in a second direction;
    wherein said first direction has a first directional component and said second direction has a second directional component opposing said first component.

2. The automotive power converter of claim 1, wherein said at least one conductive member is shaped, and said first and second terminals are configured, such that the current that flows from said first terminal to said first device portion flows in said first direction at said first device portion and the current that flows from said second terminal to said second device portion flows in said second direction at said second device portion.

3. The automotive power converter of claim 2, wherein an angle between said first and second directions is at least 90 degrees.

4. The automotive power converter of claim 3, wherein said angle between said first direction and said second second direction is approximately 180 degrees.

5. The automotive power converter of claim 2, further comprising third and fourth electronic devices on said substrate and wherein said at least one conductive member comprises first and second conductive members, said first conductive member comprising said first and second device portions and said second conductive member having a third device portion electrically coupled to said third electronic device and a fourth device portion electrically coupled to said fourth electronic device.

6. The automotive power converter of claim 5, further comprising third and fourth terminals electrically coupled to said second conductive member such that when a power supply is connected coupled to said third and fourth terminals, current flows from said third terminal to said third device portion substantially in a third direction and from said fourth terminal to said fourth device portion substantially in a fourth direction, and wherein said third direction is substantially parallel with said first direction and said fourth direction is substantially parallel with said second direction.

7. The automotive power converter of claim 6, wherein said first and second electronic devices are coupled to said first conductive member and further comprising a plurality of wire bonds interconnecting said third and fourth electronic devices and said respective third and fourth device portions, respectively, of the second conductive member.

8. The automotive power converter of claim 7, wherein said first and second terminals are located on opposing sides of said first and second device portions, of the and said third and fourth terminals are located on opposing sides of said the third and fourth device portions.

9. The automotive power converter of claim 8, wherein said first, second, third, and fourth electronic devices each include a semiconductor substrate having at least one of a transistor and a diode formed thereon.

10. The automotive power converter of claim 9, wherein said substrate comprises first, second, third, and fourth sides, said first side opposing said the second side and said third side opposing said fourth side, and wherein said first and third terminals are on said first side of said substrate and said second and fourth terminals are on said second side of the substrate, and further comprising a fifth terminal on said third side of said substrate and coupled to said first and second conductive members and said first, second, third, and fourth electronic devices such that when current flows from the respective terminals to said first, second, third, and fourth devices portions, current also flows from said first, second, third, and fourth electronic devices to said fifth terminal.

11. An automotive power inverter for use with a power supply, comprising:
    a substrate;
    first and second electronic devices on said substrate;
    a bus bar coupled to said substrate, said bus bar having a first device portion electrically coupled to said first electronic device and a second device portion electrically coupled to said second electronic device; and
    first and second terminals electrically coupled to said bus bar on opposing sides of said first and second electronic devices such that when a power supply is connected to said first and second terminals, current flows from said first terminal to said first device portion in a first direction and from said second terminal to said the second device portion in a second direction, wherein an angle between said first and second directions is at least 90 degrees.

12. The automotive power inverter of claim 11, wherein said first and second terminals are located on respective first and second opposing sides of said substrate, and further comprising a third terminal on a third side of the substrate and coupled to said bus bar and to said first and second electronic devices, such that when current flows from said respective terminals to said first and second device portions, current also flows from said first and second electronic devices to said third terminal.

13. The automotive power inverter of claim 12, wherein said first and second electronic devices are configured to convert direct current to alternating current.

14. The automotive power inverter of claim 13, wherein said bus bar is shaped, and said first and second terminals are configured, such that the current flowing that flows from said first terminal to said first device portion flows substantially in said first direction at said first device portion, and the current flowing that flows from said second terminal to said second device portion flows substantially in said second direction at said second device portion.

15. The automotive power inverter of claim 14, wherein said substrate is ceramic and said bus bar is made of copper.

16. An automotive drive system comprising:
   an electric motor;
   a direct current (DC) power supply coupled to said electric motor;
   a power inverter coupled to said electric motor and to said DC power supply to receive DC power from said DC power supply and provide alternating current (AC) power to said electric motor, the power inverter comprising:
      a substrate;
      first and second electronic devices on said substrate;
      at least one conductive member coupled to said substrate, said at least one conductive member having a first device portion electrically coupled to said first electronic device, and a second device portion electrically coupled to said second electronic device; and
      first and second terminals electrically coupled to said at least one conductive member such that when said a DC power supply is coupled to said first and second terminals, current flows from said first terminal to said first device portion in a first direction and from said second terminal to said the second device portion in a second direction, wherein an angle between said first and second directions is at least 90 degrees; and
   a processor in operable communication with and configured to control said electric motor, said DC power supply, and said power inverter.

17. The automotive drive system of claim 16, wherein said the first and second terminals are located on respective first and second opposing sides of said the substrate, and further comprising a third terminal on a third side of said substrate and coupled to said bus bar and said first and second electronic devices, such that when current flows from said the respective terminals to said first and second device portions, current also flows from said first and second electronic devices to said third terminal.

18. The automotive drive system of claim 17, wherein said the first and second terminals are electrically coupled to said DC power supply and said third terminal is electrically coupled to said electric motor.

19. The automotive drive system of claim 18, wherein said the first electronic device comprises a semiconductor substrate having a transistor formed thereon, and said second electronic device comprises is a semiconductor substrate having a diode formed thereon.

20. The automotive drive system of claim 19, wherein said the substrate is ceramic and said bus bar is made of copper.

* * * * *